(12) United States Patent
Nakagaki et al.

(10) Patent No.: US 7,202,804 B2
(45) Date of Patent: Apr. 10, 2007

(54) DIGITAL SIGNAL PROCESSING AMPLIFIER

(75) Inventors: Toshiya Nakagaki, Kawachinagano (JP); Fumiyasu Konno, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 249 days.

(21) Appl. No.: 11/058,177

(22) Filed: Feb. 16, 2005

(65) Prior Publication Data
US 2005/0184891 A1 Aug. 25, 2005

(30) Foreign Application Priority Data
Feb. 23, 2004 (JP) ............................. 2004-045887

(51) Int. Cl.
*H03M 1/06* (2006.01)
(52) U.S. Cl. .................................. 341/118; 341/110
(58) Field of Classification Search ......... 341/115–119
See application file for complete search history.

(56) References Cited

U.S. PATENT DOCUMENTS 5,793,598 A * 8/1998 Watanabe et al. ........... 361/144
5,844,744 A * 12/1998 Suzuki et al. ............ 360/78.09
6,101,474 A * 8/2000 Fujibayashi ................ 704/278

FOREIGN PATENT DOCUMENTS

| JP | 4-132749 | 12/1992 |
|---|---|---|
| JP | 7-044999 | 2/1995 |
| JP | 7-273650 | 10/1995 |

* cited by examiner

*Primary Examiner*—Lam T. Mai
(74) *Attorney, Agent, or Firm*—Wenderoth, Lind & Ponack, L.L.P.

(57) ABSTRACT

A digital signal processing amplifier produces substantially no digital clipping. The amplifier includes an A/D converter provided with an overflow detecting function and a controller for communicating with external equipment and adapted such that an overflow of an input signal is detected and thereby an output level of a head unit serving as a source of the analog input signal is controlled.

3 Claims, 4 Drawing Sheets

DIGITAL SIGNAL PROCESSING AMPLIFIER

FIELD OF THE INVENTION

The present invention relates to a power amplifier being a digital signal processing amplifier including an A/D converter and independent of a head unit commonly used as source equipment for vehicle-mounted audio equipment.

BACKGROUND OF THE INVENTION

If it is attempted to obtain vehicle-mounted audio equipment with higher power and higher quality, the power amplifier therein tends to become larger in size. Therefore, a power amplifier independent of the head unit is commonly used.

The input to the power amplifier can be either a digital signal or an analog signal. Since a head unit includes analog audio sources such as a radio other than digital audio sources such as a CD, analog signals are generally outputted from the head unit.

Since digital signal processors for audio signal processing have come to be used recently, those including an A/D converter and a D/A converter have vehicle-mounted audio equipment. By the employment of such audio signal processing DSPs, it has become possible to realize filters and the like having desired characteristics in power amplifiers with ease and at low cost.

While such an audio signal processing DSP is used in a power amplifier, if an analog signal with a level higher than a full-scale level is inputted to an A/D converter at the pre-stage of the audio signal processing DSP, a digital clip occurs to produce a very discordant noise. Therefore, the analog audio signal is required to be suppressed at a level sufficiently lower than the full-scale level. Suppressing the analog audio signal level to such a level degrades the signal-to-noise ratio (SNR), and therefore, the number of bits processed in the digital processing at the post stage is substantially reduced so that the quality of sound is deteriorated.

Accordingly, instead of greatly lowering the analog audio signal level, there is a way whereby the deterioration in the quality of sound can be prevented by having an overflow from an A/D converter detected and the signal is compensated so as not to produce a digital clip.

Since a digital clip produces a larger distortion than an analog clip dependent on the power supply voltage, it causes great annoyance to the ear. Hence, the overflow detection and the data correction are required to be made at high speed.

As a conventional digital signal processing amplifier, there is one shown in FIG. 5.

FIG. 5 is a schematic diagram showing a configuration of the conventional digital signal processing amplifier. In FIG. 5, the conventional digital signal processing amplifier includes input buffer amplifiers $1a$–$1c$ made up of a plurality of amplifiers with different gains, A/D converter 2 for converting an analog output signal from input buffer $1a$, $1b$ or $1c$ into a digital signal, switches $3a$–$3c$ inserted between input buffers $1a$–$1c$ and A/D converter 2 for making and breaking connections therebetween, and gain controller 4 for monitoring an overflow of the output digital signal from A/D converter 2 to thereby control closing and opening of switches $3a$–$3c$.

Operation of the conventional digital signal processing amplifier will be described below.

An analog input signal from the input terminal is inputted to input buffer amplifiers $1a$–$1c$ with different gains and analog output signals at different signal levels are outputted from input buffer amplifiers $1a$–$1c$, respectively. Suppose now that switch $3a$ between input buffer amplifier $1a$ with the smallest gain and A/D converter 2 is closed and the other switches $3b$, $3c$ are open. Then, an analog output signal from input buffer amplifier $1a$ at the lowest signal level is inputted to A/D converter 2 and the input signal is converted into a digital signal and outputted to the output terminal. Meanwhile, this digital output signal is also inputted to gain controller 4, and when there is a sufficient margin of the signal level to be processed, the switch is turned over from switch $1a$ to switch $1b$ or $1c$, so that the range to the full-scale of A/D converter 2 is used to the extent possible.

In other words, gain controller 4 selects one out of input buffer amplifiers $1a$–$1c$ so that the output value of A/D converter 2 at the current time may be given an optimum dynamic range corresponding to its full-scale level. When the input signal level to A/D converter is reduced, its dynamic range is decreased. In other words, the number of bits used for the digital signal is decreased. Therefore, when the signal is that for an audio signal, the quality of sound becomes deteriorated and, hence, it is desired that the input signal level to A/D converter 2 be held as high as possible.

On the other hand, when an input signal level to A/D converter 2 reaches as high a level as its full-scale level, the signal becomes unable to be properly converted as a digital signal. In the case where the signal is an audio signal, a large distortion known as a digital clip is produced. Hence, it becomes necessary to select one amplifier out of input buffer amplifiers $3a$–$3c$ with the use of switches $3a$–$3c$ to prevent the occurrence of such a digital clip.

As prior art references related to the invention of this application, there are known, for example, Japanese Patent Unexamined Publication No. H07-273650, Japanese Patent Unexamined Publication No. H07-44999, and Japanese Utility Model Unexamined Publication No H04-132749.

However, such a problem is involved in digital signal processing amplifiers of the prior art examples that dynamically switching the gain in accordance with the signal level, especially with an audio signal or the like, is difficult to attain.

SUMMARY OF THE INVENTION

The present invention aims at the provision of a digital signal processing amplifier capable of decreasing a distortion due to digital clipping without inviting deterioration in the quality of sound in digital signal processing.

In order to achieve the above-mentioned object, the present invention, in a digital signal processing amplifier receiving an analog input signal, includes a control portion for detecting an excessively strong signal or an overflow and communicating with external equipment. By virtue of such a configuration, an overflow of the input signal can be detected and the output level of the external equipment serving as a signal source can be controlled, and thereby the occurrence of digital clipping or the like can be substantially suppressed.

As described above, the present invention is able to reduce deterioration in the quality of sound due to a decrease in dynamic range and to substantially eliminate digital clipping. Further, when an on-vehicle communications system is well established in a vehicle, the present invention can be realized without substantially adding hardware thereto.

DETAILED DESCRIPTION OF THE PREFERRED EMBODIMENTS

Embodiments of the present invention will be described below with reference to the accompanying drawings.

(First Embodiment)

Figure 1:
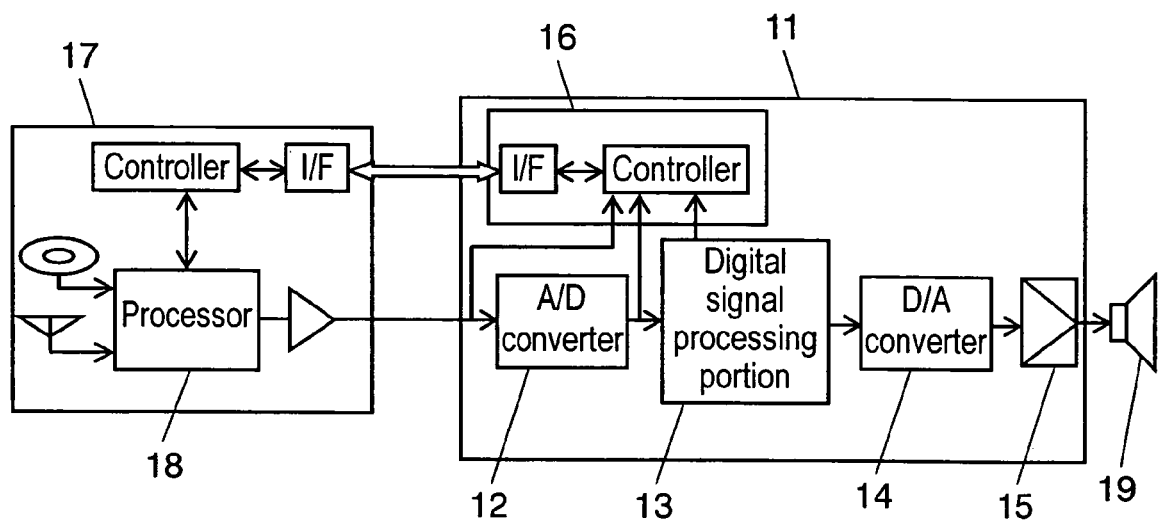
FIG. 1 is a block diagram showing a configuration of a digital signal processing amplifier according to a first embodiment of the present invention.

FIG. 1 is a block diagram showing a configuration of a digital signal processing amplifier 11 in a first embodiment of the present invention.

In FIG. 1, digital signal processing amplifier 11 according to the first embodiment includes A/D converter 12 for converting an analog signal such as an audio signal from an input portion of digital signal processing amplifier 11 into a digital signal, digital signal processing portion 13 for code converting the digital signal from A/D converter 12, D/A converter 14 for converting the digital signal from digital signal processing portion 13 into an analog signal, power amplifier 15 for power amplifying the analog signal from D/A converter 14 into a speaker driving signal to be supplied to speaker 19, and controller 16 for detecting an excessively strong signal, overflow, or the like for generating a control signal with use of software and controlling external equipment with the use of a communication interface.

Further, head unit 17 is made up of an outputting portion of an analog signal such as an audio signal, an input/output portion for transmitting and receiving a communication control signal to and from digital signal processing amplifier 11, and processor 18 for generating an audio signal and converting the signal into a specified analog signal.

An input signal line into digital signal processing amplifier 11 is connected to A/D converter 12 and controller 16. An output signal line from A/D converter 12 is connected to digital signal processing portion 13 and controller 16. An output signal line from digital signal processing portion 13 is connected to D/A converter 14 and controller 16. Further, an output signal line from D/A converter 14 is connected to power amplifier 15. Incidentally, an output signal line from power amplifier 15 is connected to speaker 19.

Operation of digital signal processing amplifier 11 in the first embodiment of the present invention will be described below.

An analog signal as an audio signal is inputted from head unit 17 serving as source equipment (a source device) into A/D converter 12 and controller 16 within digital signal processing amplifier 11. A/D converter 12 converts the input analog signal into a digital signal and outputs the digital signal to digital signal processing portion 13 and controller 16. In digital signal processing portion 13, the signal is adjusted for volume, bass, treble, balance, and so on, and the adjusted signal is output to D/A converter 14 and controller 16. In D/A converter 14, the digital signal is converted into an analog signal and the analog signal is then turned into a signal for driving a speaker in power amplifier 15 to be outputted to the output portion.

When, on the other hand, the analog signal input to digital signal processing amplifier 11 is an excessively strong signal, controller 16 detects the occurrence of such an excessively strong signal or an overflow on the basis of at least one of three signals, i.e., the input excessively strong signal per se, a digital signal obtained by conversion of the excessively strong signal in A/D converter 12, and a digital signal output from digital signal processing portion 13 and, then, controls head unit 17 as the source equipment through a communication interface so that the level of the excessively strong signal is suppressed.

When, for example, an analog signal input to digital signal processing amplifier 11 is an excessively strong signal, a digital clip occurs if it exceeds the full-scale value of A/D converter 12. In the case where A/D converter 12 is provided with an overflow detecting function, the overflow output can be acknowledged by controller 16. Controller 16 transmits control information to head unit 17 through the communication interface to lower the output level from head unit 17 to such a level as not to cause an overflow from A/D converter 12. Thus, the overflow from A/D converter 12 is eliminated and digital clipping is also suppressed.

Incidentally, if D/A converter 14 and power amplifier 15 are replaced with a digital amplifier capable of directly power amplifying a digital signal, a further effective system configuration can be achieved.

There is a case where the control information is not given to head unit 17, but given to another device such as a switch module (not shown). Since these devices are in connection with a shared on-vehicle communications system, communication of information therebetween is made possible.

By virtue of the above described configuration, deterioration in the quality of sound can be prevented and a digital clip can be substantially eliminated. In addition, such an effect can be obtained that digital signal processing amplifier 11 can be effectively realized without adding hardware thereto.

As the on-vehicle communications system, having a communication speed of 1 Mbps is already put into practice. Even if a signal at 20 kHz as the upper limit of the audio frequency is considered, it is considered possible to communicate control information of 50 bits during a period of 50 µs. Accordingly, even when a digital clip occurs at an instant, it can be controlled within a sufficiently short period of time and reproduction of music not annoying the listener can be realized.

(Second Embodiment)

Figure 2:
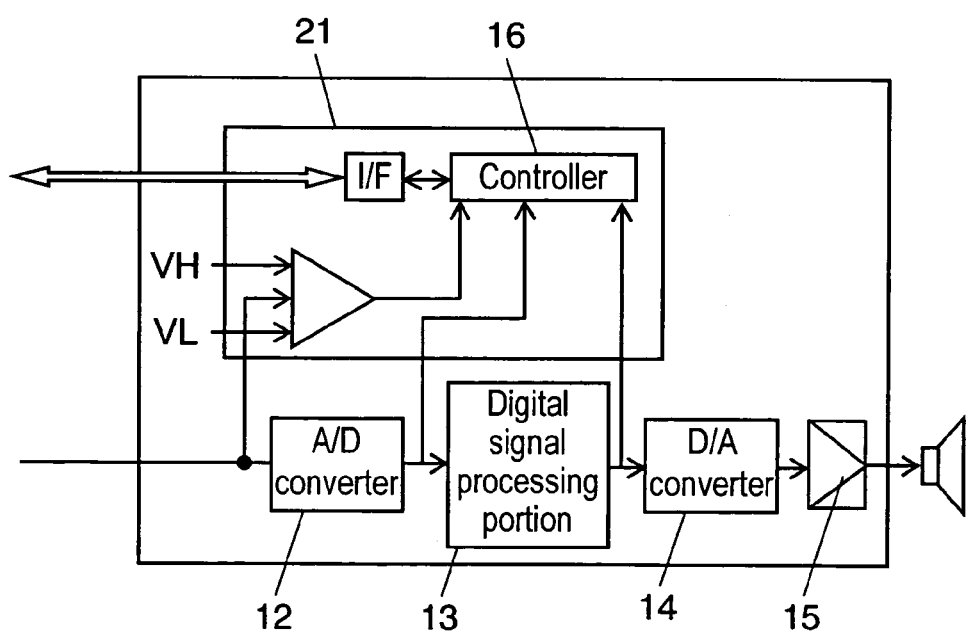
FIG. 2 is a block diagram showing a configuration of a digital signal processing amplifier according to a second embodiment of the present invention.

FIG. 2 is a block diagram showing a configuration of a digital signal processing amplifier according to a second embodiment of the present invention.

In FIG. 2, the basic structure and the principle of reproduction of music are the same as described in the first embodiment and, therefore, explanation thereof will be omitted and points differing from it will be described below.

Window comparator 21 is adapted to receive an analog audio signal that is inputted to a digital signal processing amplifier, an upper limit voltage VH, and a lower limit voltage VL, while it has its output signal line connected to controller 16. The upper limit voltage VH and the lower limit voltage VL are determined so as not to exceed the input dynamic range of A/D converter 12.

Operation of the same will be described below.

The output of window comparator 21 is rendered active when an analog signal such as an audio signal becomes over the upper limit voltage VH or under the lower limit voltage VL. The state of its being active means that an overflow has occurred in A/D converter 12. Controller 16, upon detection of the active state, transmits control information to head unit 17 through a communication interface to lower the output level of head unit 17 to a level at which no overflow is produced in A/D converter 12. Thereby, the overflow from A/D converter 12 is eliminated and the digital clip is also suppressed.

By virtue of the above-described structure, such an effect can be obtained that an overflow is suppressed even if A/D converter 12 having no overflow detecting function is used.

(Third Embodiment)

In the third embodiment, the basic structure and principle of reproduction of music are the same as described in the first embodiment and, therefore, explanation thereof will be omitted and points differing from it will be described below.

Controller 16 not only has the function to transmit the control information as mentioned in the first embodiment, but has software for taking in the value of a digital signal at the input or output of digital signal processing portion 13 thereby detecting or predicting an overflow.

Operation of the same will be described below.

Figure 3:
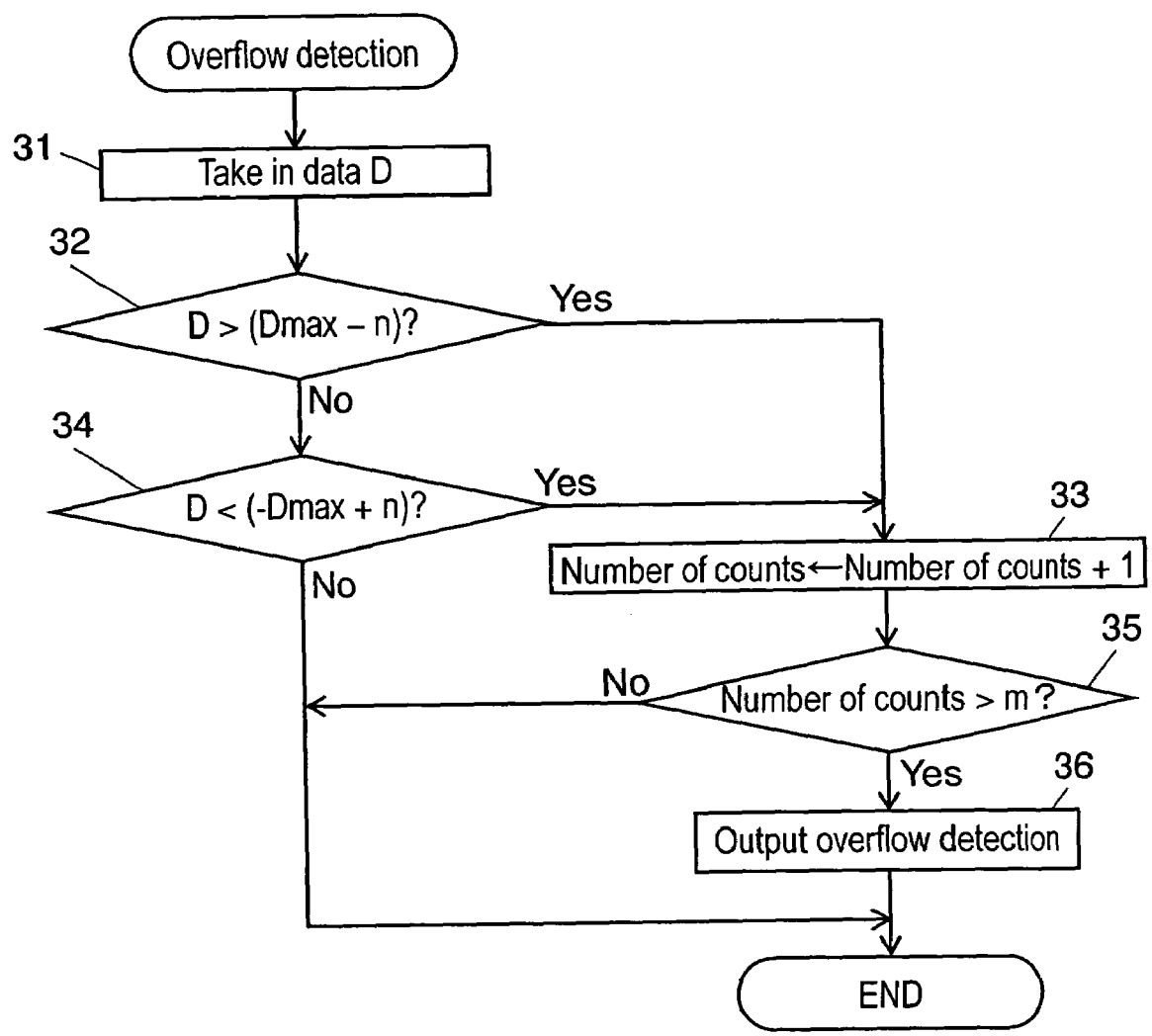
FIG. 3 is a flowchart showing an overflow detecting operation in a third embodiment of the present invention.
Figure 4:
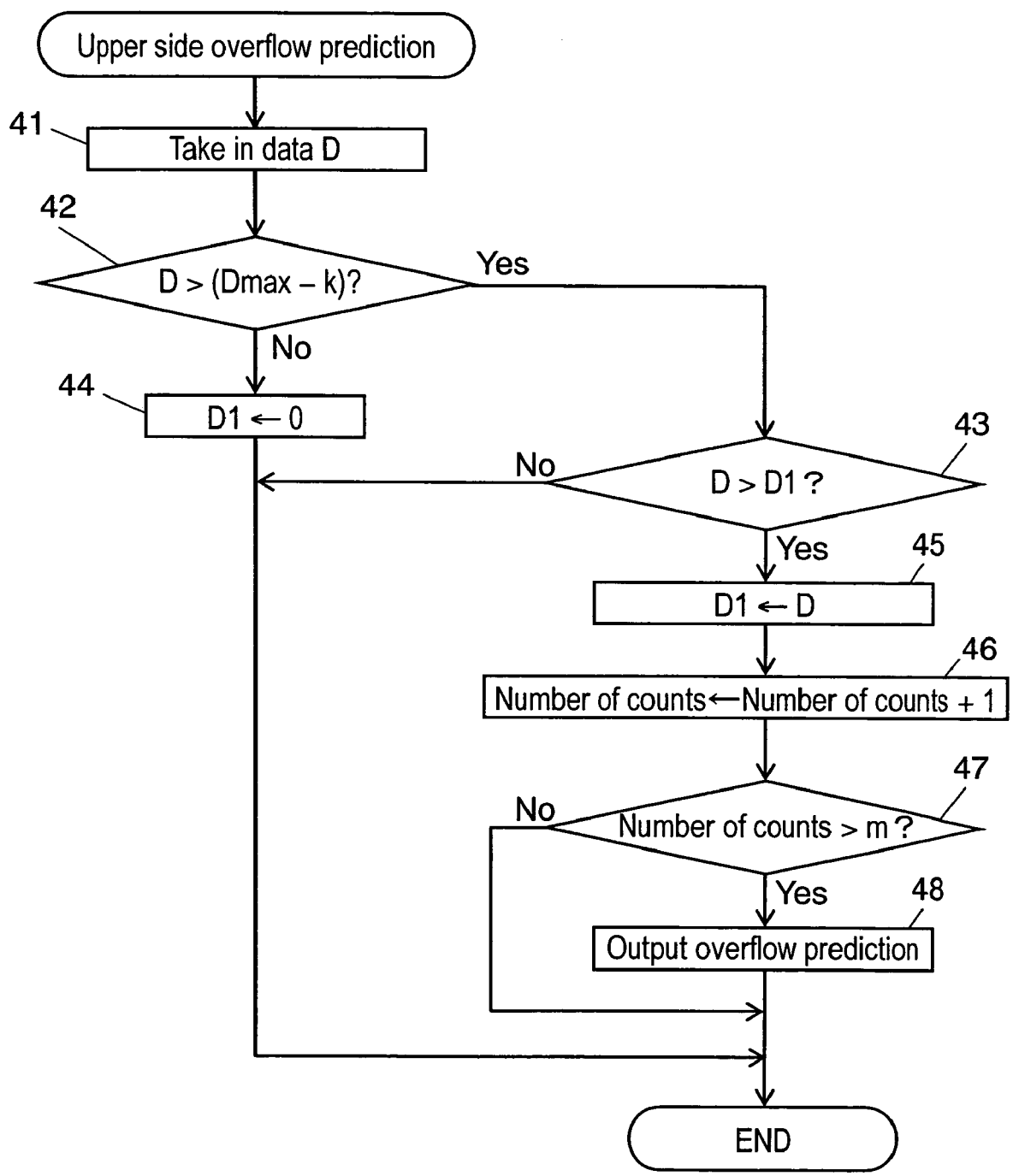
FIG. 4 is a flowchart showing an overflow predicting operation in the third embodiment of the present invention.
Figure 5:
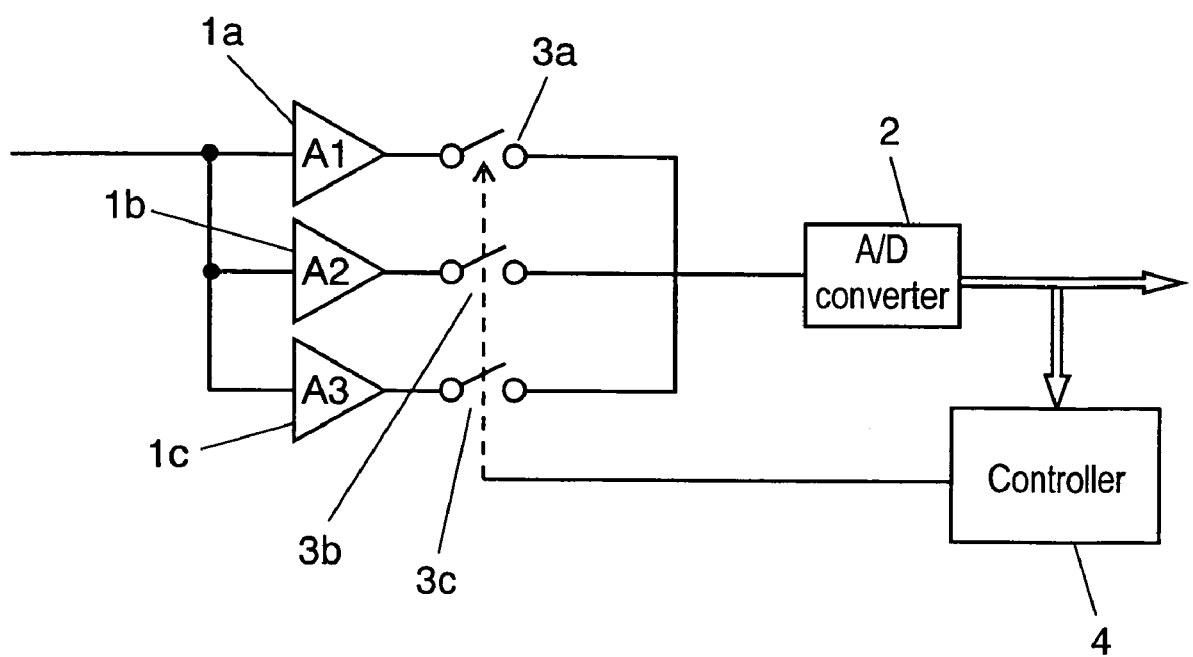
FIG. 5 is a schematic diagram showing a configuration of a conventional digital signal processing amplifier.

FIG. 3 is a flowchart showing a detecting operation of an overflow in the digital signal processing amplifier of the third embodiment of the present invention. FIG. 4 is a flowchart showing a predicting operation of an overflow in the third embodiment of the present invention. The routines shown in FIG. 3 and FIG. 4 are periodically executed at a period shorter than the period corresponding to the maximum value of the audio frequency.

First, the algorithm for determining an overflow will be described with reference to FIG. 3. At step 31, digital data D of the current digital signal is taken in. The maximum value of digital data D is defined as Dmax and set in accordance with the conversion data length of A/D converter 12. When the data length is 16 bits, for example, Dmax is given as Dmax=32768.

At this time, a reference value is set to be smaller than Dmax by n. If this value n is sufficiently large, occurrence of distortion due to digital clipping can be prevented almost completely. However, in order not to decrease the number of substantial bits, it is desired to set it at such a value that will not cause a digital clip that annoys the listener.

At step 32, digital data D is compared with the upper limit of reference value, Dmax−n. If D>Dmax−n, the number of counts is counted up by "1" at step 33. If not, digital data D is compared with the lower limit of reference value, −Dmax+n, at step 34. If D<−Dmax+n, the number of counts is counted up by "1" at step 33. If not, the routine is ended.

When the number of counts is counted up at step 33, the number of counts is compared with a reference number of counts m at step 35. Reference number of counts m is determined, in view of the operating period p of the overflow detecting routine, at such a number that allows a plurality of repetitions to be made within a period of 50 μs corresponding to the maximum frequency 20 kHz of the audio signal. More specifically, supposing that the routine operating period p is expressed as p=1 μs, m may be determined at around m=5. If, at this time, the number of counts is larger than m, i.e., number of counts >m, it is determined that an overflow has occurred and the output of the overflow detection is rendered active at step 36. If the number of counts ≦m holds, the routine is ended.

Now, the algorithm for predicting an overflow will be described with reference to FIG. 4. Here, only prediction of an overflow on the upper side corresponding to the procedure to be followed in the case where digital data D of the digital signal approaches the largest value, i.e., the upper limit, is shown. Prediction of an overflow on the lower side can be considered similarly.

At step 41, digital data D of the current digital signal is taken in. Then, a reference value is set to be smaller than Dmax by k. Value k is set to be larger than constant n used in the above described overflow determination. At step 42, digital data D is compared with reference value, Dmax−k, and, if D>Dmax−k, digital data D of current digital data D is compared at step 43 with digital data D1 in the preceding comparison. If D<Dmax−k, the value of D1 is reset at step 44 and the routine is ended.

Further, if D>D1 at step 43, the value of previous digital data D1 is updated to present data D and the number of counts is counted up by "1" at step 46. If D<D1, the routine is ended. At step 47, the number of counts is compared with the reference number of counts m. The value of m may be substantially the same as the constant used in the above-described determination of overflow. If, here, number of counts >m holds, it is determined that an overflow is predicted and the output of overflow prediction is rendered active at step 48. When number of counts ≦m holds, the routine is ended.

When the overflow determining algorithm is compared with the overflow predicting algorithm, the algorithm for determining overflow can be executed by following smaller number of steps and, hence, the load on the digital signal processing portion 13 can be reduced. On the other hand, the overflow predicting algorithm can suppress a digital clip in advance and, hence, it provides such a meritorious effect that better control conforming to various auditory characteristics is performed.

By virtue of the above-described configuration, such effects can be obtained from the present invention that an overflow from A/D converter 12 can be detected or predicted without adding hardware thereto and, since it uses only software, flexible control conforming to various characteristics of the listener's sense of hearing can be obtained.

The digital signal processing amplifier of the present invention provides such effects that deterioration in the quality of sound due to decrease in dynamic range can be prevented and, in addition, a digital clip can be substantially eliminated, and therefore, it is useful as such equipment as a power amplifier in an audio system of a vehicle having an on-vehicle communications system.

What is claimed is:

1. A digital signal processing amplifier comprising:
an A/D converter for converting an analog input signal from a source device into a digital signal;
a digital signal processing portion for processing the digital signal output from the A/D converter;
a D/A converter for converting the processed digital signal output from the digital signal processing portion into an analog signal;
a power amplifier for amplifying the analog signal output from the D/A converter into a driving signal for a speaker; and
a controller, wherein
the controller is operable to monitor the analog input signal, the digital signal output from the A/D converter, and the processed digital signal output from the digital signal processing portion so as to detect an excessively strong signal or an overflow and transmit a control signal to the source device so that a signal level of the analog input signal is suppressed.

2. A digital signal processing amplifier comprising:

an A/D converter for converting an analog input signal from a source device into a digital signal;

a digital signal processing portion for processing the digital signal output from the A/D converter;

a D/A converter for converting the processed digital signal output from the digital signal processing portion into an analog signal;

a power amplifier for amplifying the analog signal output from the D/A converter into a driving signal for a speaker; and a controller, wherein the controller is operable to monitor the analog input signal, the digital signal output from the A/D converter, and the processed digital signal output from the digital signal processing portion so as to detect an excessively strong signal or an overflow and transmit a control signal to the source device so that a signal level of the analog input signal is suppressed, and wherein a portion of the controller for detecting the excessively strong signal is a window comparator.

3. A digital signal processing amplifier comprising:

an A/D converter for converting an analog input signal from a source device into a digital signal;

a digital signal processing portion for processing the digital signal output from the A/D converter;

a D/A converter for converting the processed digital signal output from the digital signal processing portion into an analog signal;

a power amplifier for amplifying the analog signal output from the D/A converter into a driving signal for a speaker; and a controller, wherein the controller is operable to monitor the analog input signal, the digital signal output from the A/D converter, and the processed digital signal output from the digital signal processing portion so as to detect an excessively strong signal or an overflow and transmit a control signal to the source device so that a signal level of the analog input signal is suppressed, and wherein the controller is operable to predict the overflow of the digital signal output from the A/D converter or the processed digital signal output from the digital signal processing portion by comparing the digital signal with a previous digital signal or the processed digital signal with a previous processed digital signal, respectively, and the analog input signal from the source device is controlled in accordance with the prediction.

* * * * *